United States Patent

[11] 3,603,896

[72] Inventor Richard Calvin Havens
Scottsdale, Ariz.

[21] Appl. No. 889,133
[22] Filed Dec. 30, 1969
[45] Patented Sept. 7, 1971
[73] Assignee Motorola, Inc.
Franklin Park, Ill.

[54] MICROWAVE PRINTED CIRCUIT NEGATIVE RESISTANCE OSCILLATOR
11 Claims, 17 Drawing Figs.

[52] U.S. Cl. .......... 331/96, 331/107 R, 331/107 G, 333/84 M
[51] Int. Cl. .......... H03b 7/14
[50] Field of Search .......... 331/96, 97, 101, 107 R, 107 G, 107 T; 333/82 B, 83 R, 84 M

[56] References Cited

UNITED STATES PATENTS

| | | | |
|---|---|---|---|
| 3,336,535 | 8/1967 | Mosher | 331/107 G |
| 3,421,122 | 1/1969 | Ito et al. | 333/82 |
| 3,443,244 | 5/1969 | Cook | 331/107 X |
| 3,462,709 | 8/1969 | Mitchell, Jr. | 331/96 |

*Primary Examiner*—Roy Lake
*Assistant Examiner*—Siegfried H. Grimm
*Attorney*—Mueller, Aichele & Rauner

ABSTRACT: An oscillator is disclosed in which the high frequency, as well as a portion of the direct current circuitry, is printed on both sides of a thin sheet of dielectric, the printed circuit being enclosed in a chamber having conductive walls, and in which the frequency and the output power are adjustable by adjusting the position of sapphire rods with respect to the printed circuit.

INVENTOR
Richard Calvin Havens

BY
Mueller, Aichele & Rauner
ATTY'S

INVENTOR.
BY Richard Calvin Havens
Mueller, Aichele & Rauner
ATTY'S.

MICROWAVE PRINTED CIRCUIT NEGATIVE RESISTANCE OSCILLATOR

BACKGROUND

When an impact avalanche transit time or other type of solid-state bulk effect diode is properly DC biased, a negative resistance effect is produced whereby oscillations will be induced in nearby tuned circuitry. Such prior art oscillators are difficult and expensive to make, they are not reliable in the production of oscillations in that oscillations are not always assured merely by the manufacture thereof, and they are not easily adjustable as to frequency and power output in that the several adjustments are interdependent.

It is an object of this invention to produce an improved oscillator of the negative resistance type.

It is a further object of this invention to produce an improved oscillator of the negative resistance type that is more economical to make and to integrate with other microwave strip transmission circuitry than known such oscillators and in which the frequency and power adjustments are substantially independent of each other.

SUMMARY

In accordance with this invention, one terminal of a diode is connected to a resonant circuit which may be printed on one side of a dielectric sheet. Direct current is supplied to the diode by way of the resonant circuit and the diode holder. The oscillations produced are coupled to an output conductor which may also be printed on the dielectric sheet, for example, on the other side of the sheet. The resonant frequency is adjustable by moving a low low dielectric rod such as a sapphire rod in the vicinity of the resonant circuit. The coupling of the resonant circuit to the output conductor is adjustable by moving a low loss dielectric rod such as another sapphire rod in the vicinity of both the resonant circuit and the output conductor. The resonant circuit may be positioned in a chamber having metal walls whereby the chamber may be the ground terminal for both the direct current supplied to the diode and the output oscillations. A coaxial output line may be provided, the inner conductor of which is connected to the oscillator output conductor and the other connector of which is connected to the chamber wall. Or, if desired, the output conductor and walls of the chamber may themselves be a strip transmission line and can be directly connected to other suitable output means or integrated directly with other microwave strip transmission line circuitry made by the same printed circuit process, thereby eliminating output connectors entirely.

DESCRIPTION

The invention will be better understood upon reading the following description in connection with the accompanying drawing in which.

Figures 14, 15, 16, 17:
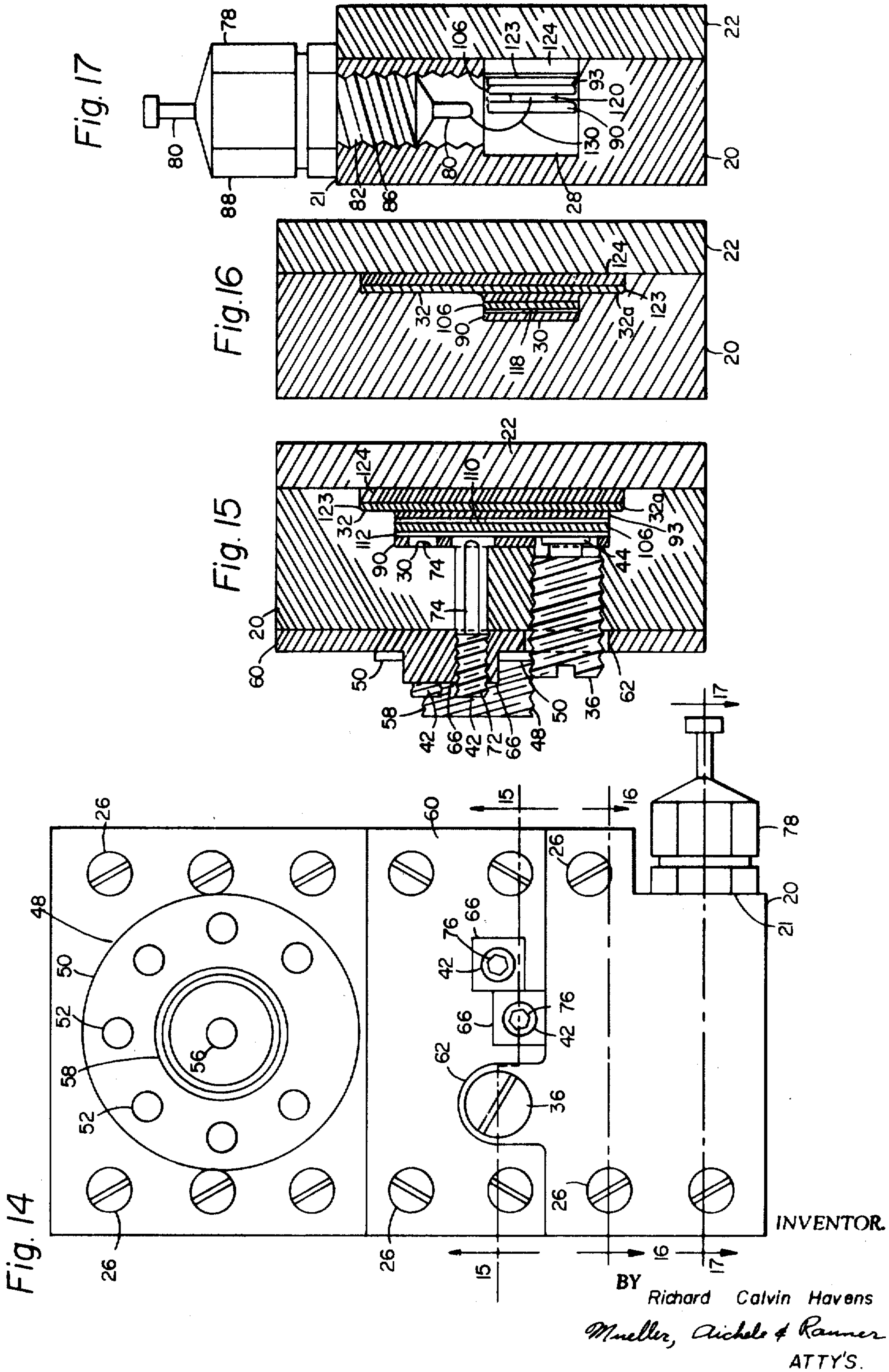
FIG. 14 is a plan view of the assembled oscillator of this invention.

FIGS. 15, 16 and 17 are sectional views taken respectively on the lines 15, 15, 16, 16, and 17, 17 of FIG. 14.

The oscillator of this invention will be described by first describing the several parts thereof.

Figures 1, 2, 3, 4, 5, 6, 7, 8, 9, 10, 11, 12, 13:
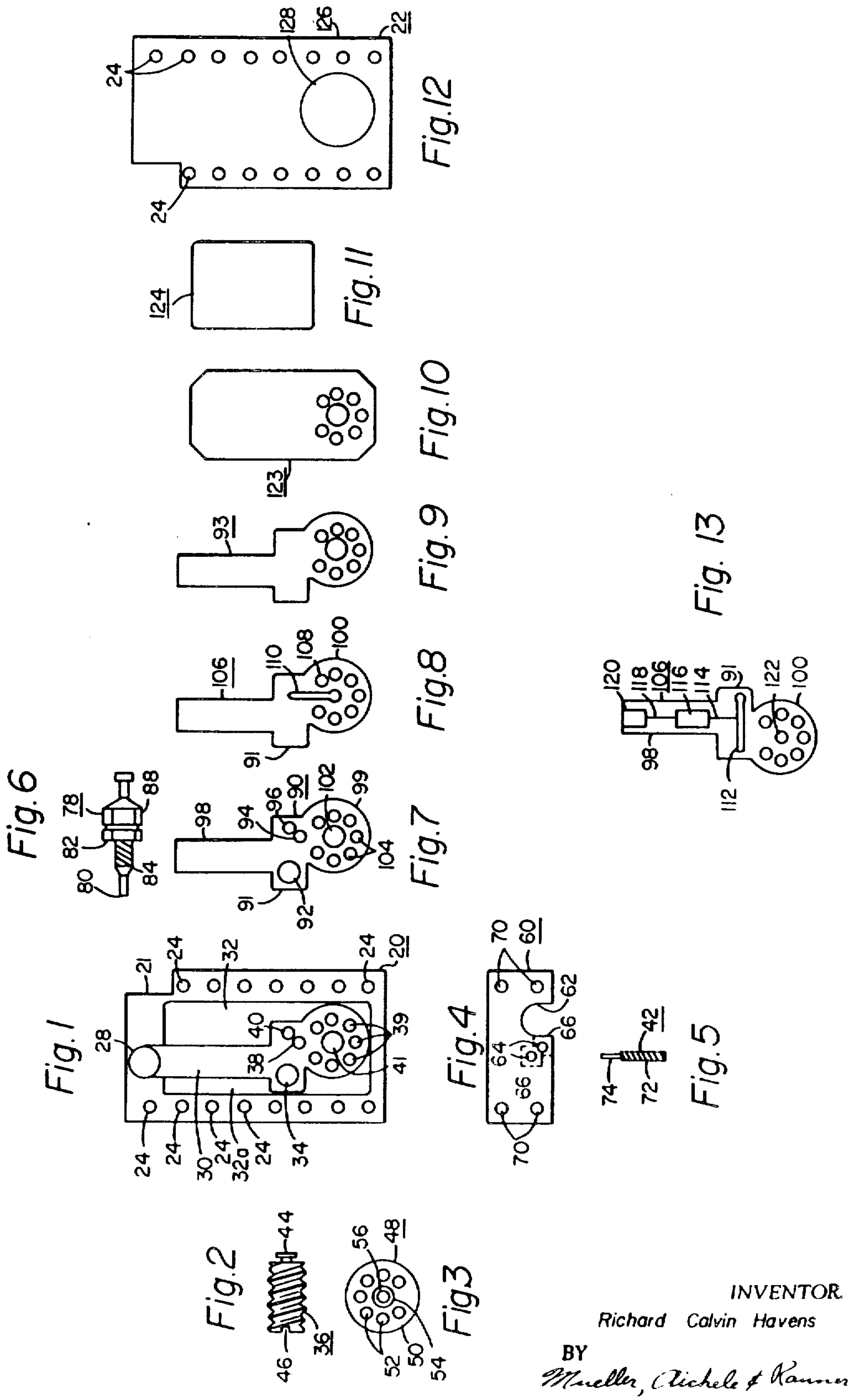
FIGS. 1 to 12 illustrate parts of the oscillator of this invention.
FIG. 13 illustrates the back of the printed circuit of FIG. 8.

FIG. 1 discloses a conductive plate 20 which, with another conductive plate 22 of FIG. 12, constitutes a chamber and a support portion of the disclosed oscillator as will be more fully described. The bottom side of the plate 20, as viewed in FIG. 1, is substantially flat, s are its several edges. A rectangular notch 21 is cut away from the corner, the upper right-hand corner as viewed in FIG. 1, from the plate 20. As will be noted, the DC connector 78 of FIG. 6 extends through a threaded hole in the long or vertical side of the notch 21. Holes 24 are provided in both of plates 20 and 22 to receive screws 26, see FIG. 14, for holding the plates 20 and 22 together. The plate 20 is hollowed out as shown. The portion of the hollow 28 is round for receiving the pin 80 of the connector 78 and the connection loop 130, see FIG. 17. The portion of the hollow 30 is deeper than the portions 32 and 32*a* thereof as better shown in FIGS. 15 and 16. A threaded hole 34 is provided to receive the diode screw 36 of FIG. 2, the hollow 30 being formed to receive the hilt portions 91 of the dielectric means of FIG. 7 (through which the screw 36 will extend, see FIG. 15). Holes 38 and 40 are each provided to receive an adjusting screw 42 of FIG. 5. The center of the hole 40 is on a horizontal line through the center of the hole 34. The center of the hole 38 is between the holes 34 and 40 but "under" the centers of the holes 34 and 40 (in FIG. 1, 38 is "under" 28). Seven holes 39 are arranged in the lower portion of the plate 20, in a circular configuration and 45° apart. A central hole 41 is provided in the center of the circular configurations of holes 39.

The metal screw 36 shown in FIG. 2 is a known article of commerce. A diode chip (not shown) is positioned in a hollow ceramic diode package which comprises an end, the right end as viewed in FIG. 2, of the screw 36. The metallic tip 44 of the diode package is connected to one terminal of the diode. The remainder of the screw 36 is connected to the other terminal of the diode. An adjusting kerf 46 is provided in the left end as viewed in FIG. 2 of the screw 36.

A high frequency coaxial connector 48, which is also an article of commerce, is shown in FIG. 3. The connector 48 comprises a flange 50 having screw receiving holes 52 therethrough and a central hole 54 therethrough. The holes 52 are positioned to register with the holes 39 of plate 20 and the hole 54 is positioned to register with the hole 41 of plate 20. The hole 54 also receives the central conductor 56 which is held centrally in the hole 54 by insulation in a known manner. An externally threaded tube 58 (see FIG. 15) is fixed to the under side of the flange 50 as viewed in FIG. 3. The flange 50 of the high frequency connector 48 is fixed by screws through the holes 52 to the bottom side of the plate 20 as viewed in FIG. 1.

An adjusting plate 60, is shown in FIG. 4. A notch 62 is provided in one edge of the plate 60 to provide clearance for the diode screw 36. Threaded holes 64 and 64 are provided in the plate 60, each of which receives an adjusting screw 42. The blocks 66, 66 which surround the holes 64, 64 and have threaded extensions of the threads in holes 64, 64 through them, are provided beneath the plate 60 as viewed in FIG. 4. The purpose of the blocks 66,66 is to provide space for the length of the sapphire rods 74 and still permit screw adjustment of the screws 42 of FIG. 5. The plate 60 is positioned on the plate 20 as shown in FIG. 15 and is fixed thereto by means of screws which extend through the hole 70 in the plate 60 and through the holes 24 of the plate 20.

Two adjusting screws 42 such as those of FIG. 5 are provided. The screw 42 comprising a threaded metal shank 72 has a sapphire rod 74 extending from one end thereof. A hexagonal hole 76 (to fit an Allen wrench) (see FIG. 14) is provided in the end of the metal portion 72 of the screw 42. As shown in FIG. 15, the two screws 42 are received in the internally threaded blocks 66,66, with the sapphire rods 74 pointed inwardly of the chamber provided by the plates 20 and 22.

A low frequency or direct current connector which includes an RF bypass capacitor 78 is shown in FIG. 6. The connector 78 is an article of commerce. It comprises a central conductive rod 80 and an outer headed bolt 82. The threaded portion 84 of the bolt 82 is received in a threaded hole 86 in the side of the block 20 at the notch 21 as shown in FIG. 17. The hexagonal head 88 of the screw 78 abuts the side of the block 20 within the notch 21. Insulation isolates the rod 80 from the hollow bolt 82 for direct current but provides a bypass for any radio frequency current that may arrive at this point.

A dielectric plate 90 is shown in FIG. 7. The dielectric plate 90 has a handle or extension 98 to fit the deeper portion 30 of the cavity in the plate 20 and a rounded portion 99 having a central hole 102 and seven holes 104 positioned to match the holes 41 and 39 in the plate 20. The center of the hole 102 is in line with one side of the handle 98. The plate has a hiltlike portion 91 between the handle portion and the circular portion. The hiltlike portion has therein a hole 92 for receiving the screw 36 and holes 94 and 96 each for receiving the sapphire end 74 of a screw 42.

The dielectric plate 106 of FIG. 8 is of the same size and shape as the plate 90 of FIG. 7. The plate 106 may be very thin and have holes 108 to match the holes 39 of the plate 20. A conductor 110 has a portion of circular configuration positioned and concentric with the rounded portion 100 of the sheet 106 and a linear portion of uniform width extending from the circular portion upwardly as viewed in FIG. 8. The conductor 110 is provided on or otherwise deposited (hereinafter "printed") on one side of the sheet 106 of FIG. 8. The other side of the sheet 106 is shown in FIG. 13. A resonant conductor 112 having the same general shape as a connector 110 is printed on the said other side of the sheet 106. This conductor 112 extends along the hilt portion 91 of the sheet 106 with the circular potion of the conductor 112 to the right, as viewed in FIG. 13. A conductor 114 is also printed on the sheet 106 and extends up from the conductor 112 that is away from the circular portion 100. Rectangular conductors 116 and 120 are printed on the handle 98, a printed conductor 118 joining the rectangles 116 and 120 and the rectangle 116 being joined to the conductor 112 by the printed conductor 114. A hole 122 is provided in the circular portion 100 for connection of the center connector 56 of the coaxial connector 48 to the round portion of the conductor 110, see FIG. 8, as by soldering. As will be noted, the conductor 112 is an element of a tuned system and the conductors 114, 116, 118, and 120 are direct current electrical connections to the conductor 112, the conductors 114 and 118 being choke coils and the conductors 116 and 120 being shunt capacitors or keeping the produced oscillations out of the DC supply. The sheet 106 is positioned (as will be further explained) in the cavity 30 with the conductor 112 upwardly, that is, towards the screw hole 34.

The dielectric sheet 93 of FIG. 9 is identical in size and shape with the sheet 90 of FIG. 7 and differs therefrom only in that the holes 92, 94, and 96 of the sheet 90 are not present in the sheet 93.

A shield 123 is shown in FIG. 10. The bottom part of the shield 123 has holes to match the holes 39 and 41 of plate 20. The shield 123 is wide enough to fit the shallow parts 32 and 32*a* of the hollow 30 of the plate 20.

A rubber pad 124 is shown in FIG. 11. The pad 124 fits the hollow 30,32, and 32*a* towards the top of the FIG. 1 and beyond the circle of holes 39 in the plate 20. The pad 124 does not interfere with the heads of the screws that extend through the holes 39.

FIG. 12 shows another plate 22 which has the shape of and fits the plate 20 and has holes 24 to match the holes 24 of FIG. 1. A circular indentation 128 of the size of the circular portion 100 of FIG. 7 and positioned to register with the circular indentation in the plate 20 is provided in the plate 22.

FIG. 14 shows a top view of the assembled oscillator and FIGS. 15, 16 and 17 show sections thereof respectively on the lines 15,15,16,16 and 17, 17 of FIG. 14. The high frequency connector 48 is positioned as shown with screws running through the shield 123, the plate 93, the printed sheet 106, the plate 90, the plate 20, and holes 52 in the flange of the connector 48. The diode screw 36 is shown in FIG. 15 screwed into the plate 20 and in the notch 62 of the plate 60 and through a hole in the sheet 90 with the end 44 of the screw 36 in contact with the round portion of the conductor 112 on the side of the sheet 106 that is shown in FIG. 13. The DC connection 78 is screwed into the hole 86 as shown in FIG. 17 with a connection 130 between the pin 80 and the shunt capacitor 120. Therefore, a DC circuit exists between the pin 80 through the shunt capacitors 116 and 120, the choke conductors 114 and 118, the tuned element 112, and the diode screw 36 to the plate 20 which may be grounded or may have reference potential applied thereto. When a sufficiently high potential is applied to the pin 80 in a direction to reverse bias the diode contained in the screw 36, the diode will break down and negative resistance will result in the circuit of the diode. Oscillations will be produced in the resonant conductor 112 at a frequency determined by its length and the capacity of the diode package included in the screw 36 and other stray packaged chip inductances and capacitances and the capacity between the conductor 112 and through the sapphire rod 74 to the conductor 112. These oscillations are included in the conductor 110 due to the close proximity of the conductors 110 and 112, the degree of the coupling being controlled by the amount of high dielectric material in a sapphire rod 74 forming part of the other screw 42 that is adjacent to the near or overlapping portions of the conductors 110 and 112. By a soldered connection through the hole 122 and through the hole 102 in the plate 90 to the center connection 56, the produced oscillations appear at the coaxial output connector 48. Sapphires 74 are used in the screws 42 since sapphire material is a very low loss high dielectric constant material. As seen in FIG. 15, the metal part 72 of the screw 42 is at a distance from the mouth of the openings through which the sapphire rods 74 extend. The high frequency produced by the oscillator does not penetrate out of the container provided by the plates 20 and 22 along the threaded contact between the threaded portion of the screw 42 and the internally threaded post 66,66 due to this distance. This structure can be considered a circular waveguide to which a wave below the waveguide's cutoff frequency is applied by operation of the oscillator. This waveguide action reduces cavity losses due to the tuning mechanism and also makes the tuning less erratic. The shape of the chamber provided by the cavities in the plates 20 and 22 is such that the dimensions thereof are small compared to the frequency produced by the described oscillator so that parasitic and higher mode oscillation frequencies are not allowed to propagate.

It will be noted that the shield 123 extends beyond the portions 90 and 100 to the right and the left in the shallow hollows 32 and 32*a* and is held in electrical contact with the plate 20 by the bolts through the holes through the shield 123 and "above" these holes by the rubber pad 124. The resilience of the pad 124 causes good contact of the shield 123 even though due to heating the dimensions of the several parts of the oscillator may vary. The parts are therefore held firmly in place between the plates 20 and 22 causing reliable operation of the oscillator.

If it is not desired to use the concentric connector 48 as an output connection, the strip 110 with the plates 20 and 22 comprise a strip transmission line and the structure of FIG. 14 below the line 16,16 may be discarded while the conductor 110 and plates 20 and 22 can be continued as an integral part of other known microwave strip transmission circuitry such as found in RF front ends of commercial radar systems.

It is obvious that the printed conductors 110, 112, 114, 116, 118, and 120 on the sheet 100 are thin compared to the sheet thickness 100. However, for the sake of ease of illustration, the showings of the thickness of the conductors 110 and 112 in FIGS. 14, 15, and 16 have been exaggerated with respect to the thickness of the sheet 106 on which they are printed.

Any diode may be used in the diode screw 36 that will produce a negative resistance upon a voltage of the proper value and direction being applied thereto. The frequency produced by the described oscillator is in the X band which is from 8 kMHz. to 12 GHz. at a power of about one-tenth to 1 watt. An oscillator has been built as described hereinabove which has a center frequency of 10.5 GHz., a tuning range of 700 MHz. a power output minimum of 63 mw., a power variation of 1.2 db. as the temperature varied over a range of −25° C. to +70° C. and a frequency drift of 20 MHz. over the same temperature range.

What is claimed is:

1. An oscillator comprising
 a series direct current circuit including a diode and a resonant line, means to apply potential to said series circuit such that negative resistance is produced therein whereby oscillations appear in said resonant line,
oscillation output means coupled to said resonant line at an intermediate point along said line,
means for adjusting the frequency produced by said oscillator comprising a low loss dielectric element which is movable toward and away from said line at a point away from said intermediate point, and
means to adjust the coupling of said line to said output means comprising a second low loss dielectric element which is movable toward and away from said line near said intermediate point.

2. The invention of claim 1 in which said resonant line is a conductor printed on one side of a dielectric sheet and in which said output means comprises a second conductor printed on the other side of said sheet, portions of said conductors being sufficiently close to provide coupling therebetween.

3. The invention of claim 2 in which said second conductor runs perpendicular to said first conductor with an end of said second conductor in at least partially over lapping position with respect to said first conductor.

4. The invention of claim 1 in which said low loss dielectric elements are of sapphire.

5. The invention of claim 4 which said sapphire elements extend particular to said resonant line.

6. An oscillation generator comprising
a metallic structure comprising a chamber having walls,
a sheet of dielectric material on one side of which a conductive resonant line is printed included in said chamber,
a diode extending through and in contact with a wall of said chamber into contact with a point on and near an end of said resonant line,
means for applying a potential across said line and said diode in series such that oscillations appear on said line,
output means comprising a conductor also printed on said sheet, portions of said conductors being near each other,
a low loss dielectric rod extending towards said resonant line, he end of said rod being close to the near portions of said line, and
a second low loss dielectric rod extending towards a point on said resonant line remote from said near portions 7. The invention of claim 6 in which said conductors are printed on respective opposite sides of said sheet and in which said near portions comprise the end of said conductor and an intermediate portion of said resonant line.

8. The invention of claim 6 in which said dielectric rods are extensions of respective conductive rods and said conductive rods extending through and being in contact with said walls of said chamber.

9. The invention of claim 8 in which said dielectric rods are sapphire.

10. The invention of claim 6 in which said chamber comprises a first and a second plate, there being a hollow in said first plate, said hollow having deep and shallow portions, a shield extending across said hollow and a resilient pad positioned between said shield and said second plate means for holding said plates together.

11. The invention of claim 6 in which the dielectric rods include metallic shank portions and are brought through a small diameter hole in the chamber walls, said hole being of sufficient length to prevent radio frequency energy from reaching the metallic portion of said rods.